(12) United States Patent
Tse et al.

(10) Patent No.: US 6,603,326 B1
(45) Date of Patent: Aug. 5, 2003

(54) TESTING INTEGRATED CIRCUITS WITH INTEGRATED POWER TRANSISTORS

(75) Inventors: Lawrence T. Tse, Fremont, CA (US); Michael A. Davis, Newark, CA (US); Anthony J. Stratakos, Fremont, CA (US)

(73) Assignee: Volterra Semiconductor Corporation, Fremont, CA (US)

( * ) Notice: Subject to any disclaimer, the term of this patent is extended or adjusted under 35 U.S.C. 154(b) by 130 days.

(21) Appl. No.: 09/766,231

(22) Filed: Jan. 19, 2001

Related U.S. Application Data

(60) Provisional application No. 60/218,433, filed on Jul. 14, 2000.

(51) Int. Cl.[7] ................................................ G01R 31/40
(52) U.S. Cl. .................... 324/765; 324/158.1; 324/415; 324/525; 323/224
(58) Field of Search ................................ 323/224, 282, 323/351; 324/415, 416, 525, 600, 158.1, 765, 768, 769, 771

(56) References Cited

U.S. PATENT DOCUMENTS 6,031,361 A * 2/2000 Burstein et al. ............ 323/224

* cited by examiner

Primary Examiner—Christine Oda
Assistant Examiner—Vincent Q. Nguyen
(74) Attorney, Agent, or Firm—Fish & Richardson P.C.

(57) ABSTRACT

A switching regulator that has first, second, third and fourth terminals, a first power transistor disposed between the first terminal and a first node, a second power transistor disposed between the first node and a second node, a filter including a capacitor and an inductor, and a controller. The first power transistor is partitioned into a plurality of individually-addressable first transistor segments. The second node couples the second and fourth terminals. The second power transistor is partitioned into a plurality of individually-addressable second transistor segments. The inductor is disposed between the first node and the third terminal, and the capacitor is disposed between the third and fourth terminals. The controller is operable in a plurality of modes including a normal mode in which the controller opens and closes all of the first transistor segments and all of the second transistor segments, and a test mode in which the controller opens and closes less than all of the first transistor segments and all of the second transistor segments.

16 Claims, 4 Drawing Sheets

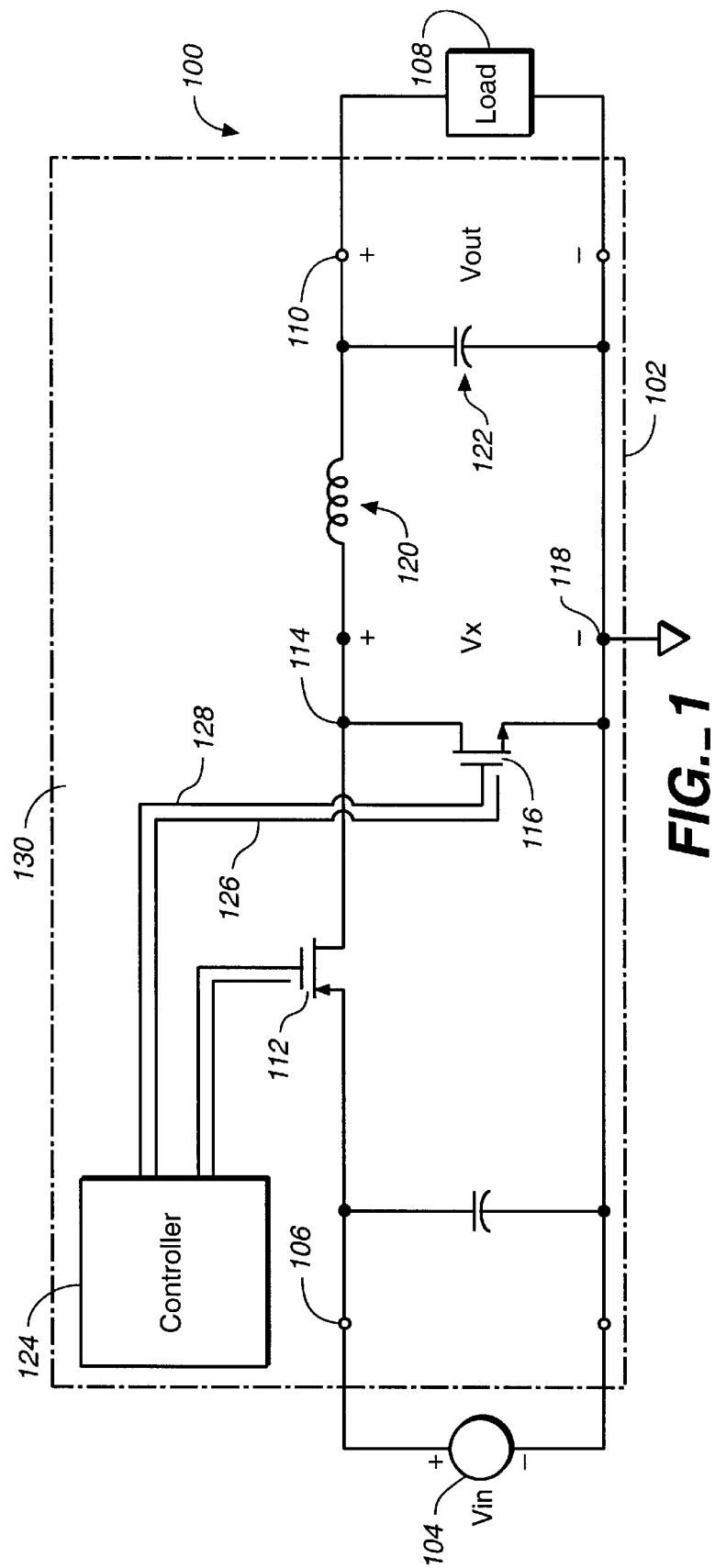
FIG._1

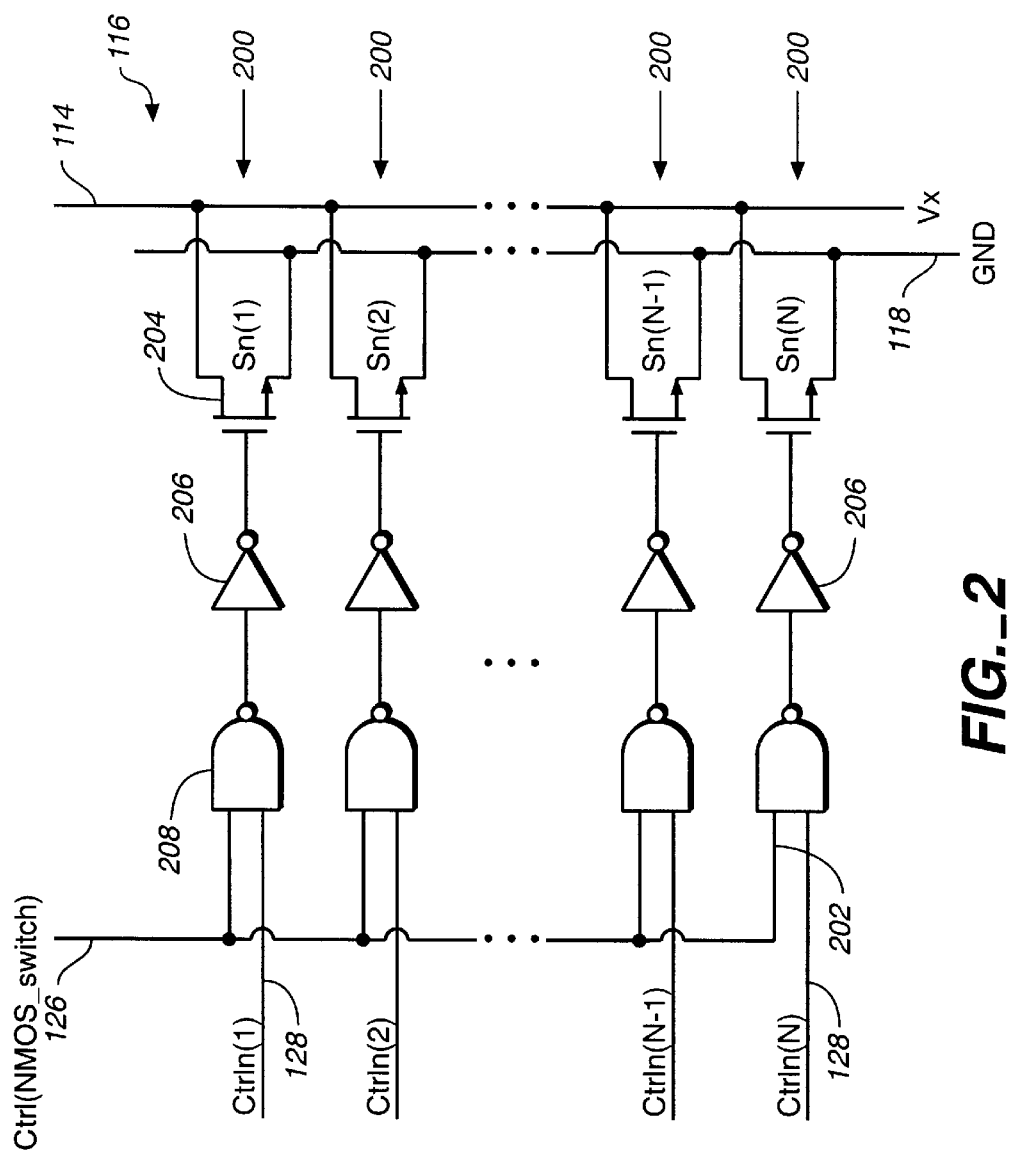
FIG._2

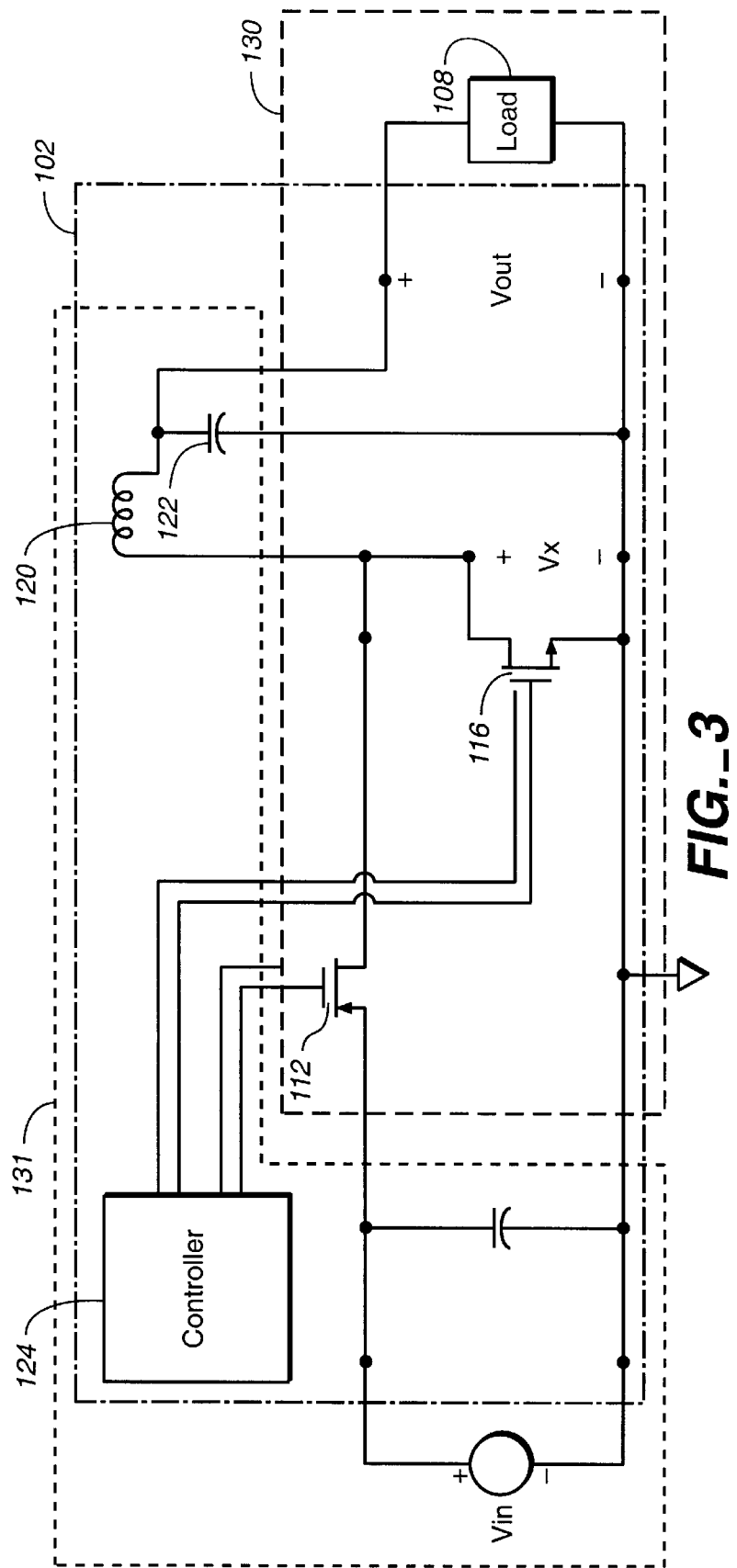
FIG._3

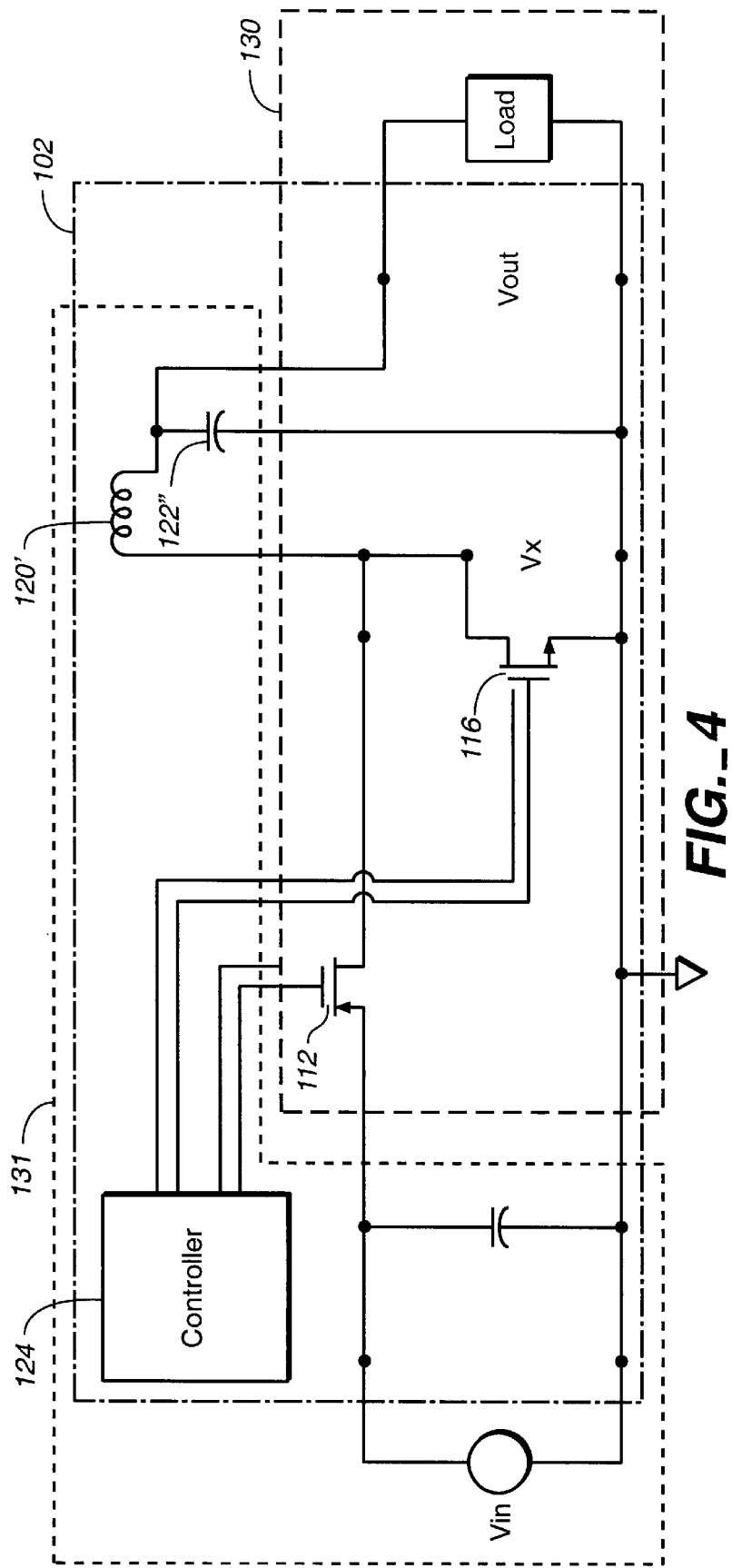
FIG._4

TESTING INTEGRATED CIRCUITS WITH INTEGRATED POWER TRANSISTORS

CROSS-REFERENCE TO RELATED APPLICATIONS

This application claims priority to provisional U.S. application Ser. No. 60/218,433, filed on Jul. 14, 2000.

BACKGROUND

The present invention relates to the design and testing of power management integrated circuits.

Power amplifiers, low drop-out regulators and voltage regulators are examples of power management integrated circuits that include power transistors. Voltage regulators, such as DC-to-DC converters, are used to provide stable voltage sources for electronic systems. Efficient DC-to-DC converters are particularly needed for battery management in low power devices, such as laptop computers and mobile phones. Switching voltage regulators (or simply "switching regulators") are known to be an efficient type of DC-to-DC converter. A switching regulator generates an output voltage by converting an input DC voltage into a high frequency voltage, and filtering the high frequency voltage to generate the output DC voltage.

Conventional synchronous switching regulators include two switches implemented with power transistors. One power transistor is used to alternately couple and decouple an unregulated input DC voltage source, such as a battery, to a load, such as an integrated circuit. The other power transistor is used to alternately couple and decouple the load to ground. An output filter, typically including an inductor and an output capacitor, is coupled between the input voltage source and the load to filter the output of the switches and produce the output DC voltage. The two power transistors are typically controlled by a pulse modulator, such as a pulse width modulator or a pulse frequency modulator.

Performance of a switching regulator is generally affected by the characteristics of the power transistors. When a power transistor is open, it is desirable to have the power transistor operate as close to an open circuit as possible, i.e., the off-resistance of the power transistor should be very high (ideally infinite). In the closed position, the power transistor should act as a close to a short circuit as possible, i.e., the on-resistance of the power transistor should be very small (ideally zero). A high on-resistance generally results in increased power dissipation in the power transistor, degrading the efficiency of the regulator.

One of the challenges in the design of switching regulators with on-chip power transistors is the testability of the device during manufacturing. As just discussed, it is desireable to minimize the on-resistance of the power transistors. Unfortunately, it is difficult to obtain an accurate measurement reading of a low on-resistance value, e.g., tens of mΩ or lower, because the package lead resistance, the socket resistance or the contact resistance of a probe during a wafer probe test or the automatic test equipment (ATE) contactor's contact resistance can be of the order of the on-resistance value. To create a voltage drop across the power transistor that is measurable at a required degree of accuracy, a substantially large DC current has to be provided to the power transistor. Recent automatic test equipment (ATE) testers that are designed to handle complex mixed-signal IC testing are typically not equipped with integrated instrumentation to measure complex mixed-signal circuits and support high current conduction simultaneously. In addition, the conduction of a high current through wafer probe tips tends to wear out the hardware very quickly, resulting in production delays and increased testing cost.

Furthermore, to test the closed-loop performance of the regulator using ATE, large currents must be conducted through the ATE, the test probes, and their associated parasitic inductance. Since the parasitic inductance introduced during ATE testing may be an order of magnitude larger than that in the typical application for the regulator, large transient voltages are created on-chip when the power transistors switch, leading to measurement inaccuracies and potentially even permanent damage to the chip.

SUMMARY

In one aspect, the invention is directed to a switching regulator having first, second, third and fourth terminals, a first power transistor disposed between the first terminal and a first node, a second power transistor disposed between the first node and a second node, a filter including a capacitor and an inductor, and a controller. The first power transistor is partitioned into a plurality of individually-addressable first transistor segments. The second node couples the second and fourth terminals. The second power transistor is partitioned into a plurality of individually-addressable second transistor segments. The inductor is disposed between the first node and the third terminal, and the capacitor is disposed between the third and fourth terminals. The controller is operable in a plurality of modes including a normal mode in which the controller opens and closes all of the first transistor segments and all of the second transistor segments, and a test mode in which the controller opens and closes less than all of the first transistor segments and all of the second transistor segments.

Implementations of the invention may include one or more of the following features. Each first transistor segment may have a source coupled to the first terminal, a drain coupled to the first node and a gate coupled to the controller through a segment control line. Each second transistor segment may have a source coupled to the first node, a drain coupled to the second node and a gate coupled to the controller through a segment control line. The controller may operate in the normal mode in response to a substantially constant load. The controller may be configured to switch to the test mode in response to a request to measure an on-resistance of a power transistor. The first power transistor may be a p-channel MOSFET and the second power transistor may be an n-channel MOSFET. All of the segments may have an equivalent transistor width.

In another aspect, the invention is directed to a method for measuring an on-resistance of a power transistor integrated onto an integrated circuit chip. The power transistor includes a plurality of individually-addressable transistor segments. Less than all of the transistor segments are closed, an on-resistance of the closed transistor segments is measured, and an on-resistance of the power transistor is derived from the on-resistances of the transistor segments.

Implementations of the invention may include one or more of the following features. The transistor segments may be closed one at a time, an on-resistance of each closed transistor segment may be measured; and an on-resistance of the power transistor may be derived by averaging the on-resistances of all of the transistor segments. The transistor segments may have an equivalent width. Each transistor segment may include one or more single transistors connected in parallel.

In another aspect, the invention is directed to a method of testing a switching regulator with a power transistor on an integrated circuit chip for use with an application board having circuitry that includes a first inductor with a first inductance and a first capacitor with a first capacitance. In the method, a power transistor including a plurality of individually-addressable transistor segments on a chip is provided. The chip is installed on a testing board having circuitry that includes a second inductor with a second inductance greater than the first inductance and a first capacitor with a second capacitance less than the first capacitance. The circuit is operated with the power transistor on the integrated circuit chip using less than all of the transistor segments, and a closed-loop performance characteristic of the switching regulator is measured.

Implementations of the invention may include one or more of the following features. The performance characteristic may be output voltage, line regulation or load regulation. Measuring the line regulation may include measuring first and second output voltages with different input voltages. Measuring the load regulation may include measuring first and second output voltages with different load currents, e.g., a minimum load current and a modified maximum load current (that is less than a maximum load current for the switching regulator when installed on an application board). The application board may have a first load current, and the test board may have a second load current that is less than the first load current. The chip may be installed on an application board having circuitry that includes the first inductor with the first inductance and the first capacitor with the first capacitance. The power transistor may include N transistor segments, and the operating step may be performed using exactly one of the N transistor segments. The first inductance may be L and the second inductance may be L*N. The first capacitance may be C and the second capacitance may be C/N. An on-resistance of a closed transistor segment may be measured during operation of the circuitry, and an on-resistance of the power transistor may be derived from the on-resistance of the closed transistor segment.

Advantages that can be seen in implementations of the invention include one or more of the following. The resistance of the power transistors in a switching regulator can be measured accurately. The resistance of the power transistors can be controlled more accurately, leading to more precisely control the switching timing. Switching-related losses can be reduced by decreasing the on-resistance of the power transistors.

The details of one or more embodiments of the invention are set forth in the accompanying drawings and the description below. Other features and advantages of the invention will become apparent from the description, the drawings, and the claims.

BRIEF DESCRIPTION OF THE DRAWINGS

FIG. 1 is a schematic diagram of a switching regulator.

FIG. 2 is a circuit diagram illustrating a power transistor from the switching regulator of FIG. 1.

FIG. 3 is a circuit diagram showing the switching regulator of FIG. 1 implemented on a chip and interfacing with an application board.

FIG. 4 is a circuit diagram showing the switching regulator of FIG. 1 implemented on a chip and interfacing with a test board.

Like reference numbers and designations in the various drawings indicate like elements.

DETAILED DESCRIPTION

In a two-switch buck-converter circuit 100 shown in FIG. 1, a switching regulator 102 is coupled to a DC input voltage source 104, such as a battery, by an input terminal 106. The switching regulator 102 is also coupled to a load 108, such as an integrated circuit, by an output terminal 110. The switching regulator 102 serves as a DC-to-DC converter between the input terminal 106 and the output terminal 110.

The switching regulator 102 includes a power switch 112 and a rectifier switch 116. The power switch 112 is a N-segment p-channel power MOSFET ("PMOS power transistor") which alternately couples and decouples the input terminal 106 to an intermediate node 114; the rectifier switch 116 is a N-segment n-channel power MOSFET ("NMOS power transistor") which alternately couples and decouples the intermediate node 114 to ground 118. The value of N—i.e., the number of segments—can be selected by a circuit designer to achieve a desired measurement accuracy (described below). A filter is configured to convert the rectangular waveform of the intermediate voltage $V_x$ at the intermediate terminal 114 into a substantially DC output voltage $V_{out}$ at the load 108. In one implementation, the filter includes an inductor 120 and an output capacitor 122.

An implementation of the rectifier switch 116 and its associated driver circuitry is shown in FIG. 2. Each segment 200 of the rectifier switch 116 includes an NMOS transistor 204. Although each segment Sn(i) is represented in FIG. 2 by a single NMOS transistor 204, where i=1 ... N, integer, it should be noted that each segment Sn(i) can be implemented by multiple single NMOS transistors connected in parallel. The segments Sn(i) are coupled such that: (a) all of the segment drains are connected to the intermediate node 114; (b) all of the segment sources are connected to ground 118; and (c) each of the segment gates are isolated and driven by a separate inverter driver 206. The input of each inverter driver 206 is coupled to an NAND gate 208. The power switch 112 can be similarly implemented.

The switching regulator 102 includes a controller 124 for controlling the operation of the power switch 112 and the rectifier switch 116. The controller 124 can be implemented using circuitry, software, or a combination of both. One input of each NAND gate 208 is connected by a common control line 126 to the controller, whereas the other input of each NAND gate 208 is connected to the controller by an individual control line 128. Each segment Sn(i) of the rectifier switch 116 is coupled to the first control line 126 by a sub-control line 202. The controller 124 controls the switching of each segment Sn(i) in the rectifier switch 116 by applying a common control signal Ctrl(NMOS_switch) to the first control line 126 and an individual control signal Ctrln(i) to each second control line 128. Thus, a transistor 204 in a specific segment turns on only when both the common control signal Ctrl(NMOS_switch) and the associated individual control Ctrln(i) are high. The switching of each segment Sp(i) in the power switch 112 can be similarly controlled by the controller 124 by applying a common control signal Ctrl(PMOS_switch) and an individual control signal Ctrlp(i).

In a normal mode of operation, the controller 124 alternately opens and closes all of the segments in the power switch 112 and the rectifier switch 116, such that an intermediate voltage $V_x$ having a rectangular waveform is generated at the intermediate terminal 114. For example, the controller 124 sets Ctrln(1 ... ,N)=1 and then alternately switches between Ctrl(NMOS_switch)=1 and Ctrl(NMOS_switch)=0 to alternately turn on all of the segments Sn(i) in the rectifier switch 116 simultaneously and then turn off all of the segments Sn(i) in the rectifier switch 116 simultaneously. Again, the power transistor 112 can be controlled similarly.

The switching regulator 102 can be fabricated such that the power switch 112, rectifier switch 116, and load 108 are located on-chip (i.e., on a single chip), and the controller 124, inductor 120 and output capacitor 122 are discrete components located off-chip. Such an implementation is shown in FIG. 3 where the chip 130 includes only the power switch 112, rectifier switch 116 and load 108.

The performance of the switching regulator 102 is affected in part by the characteristics of the power switch 112 and the rectifier switch 116. For example, to achieve high power conversion efficiency in the switching regulator 102, the on-resistance $Rdson_{total}$ of each switch should be low to minimize resistive conduction losses. The switching regulator can be operated in a segmentation measurement test mode so that the on-resistance $Rdson_{total}$[measured] of each switch can be measured. For example, assume the rectifier switch 116 (having a transistor width $W_{ntotal}$) is partitioned into N segments, each having an equivalent segment width $W_{ni}$. The ideal on-resistance $Rdson_{ni}$ [ideal] of each segment Sn(i) is defined by:

$$Rdson_{ni}[ideal]=N*Rdson_s[ideal]$$

In the segmentation measurement test mode, the following steps are performed to measure the on-resistance $Rdson_{ni}$ [measured] of each segment Sn(i) of the rectifier switch 116:
1. Close a segment Sn(i) (e.g., to close segment Sn(2) exclusively, the controller 124 sets Ctrl(NMOS_switch)= 1, Ctrln(2)=1, and Ctrln(1,3,4 . . . ,N)=0).
2. Apply a current $I_{ntest}$ to the closed segment Sn(i).
3. Measure a voltage drop $V_{ni}$ [measured] across the closed segment Sn(i).
4. Calculate the on-resistance $Rdson_{ni}$ [measured] of the closed segment Sn(i):

$$Rdson_{ni}[measured]=V_{ni}[measured]/I_{ntest}$$

where $V_{ni}$[measured] is the measured voltage drop across the closed segment Sn(i) and $I_{ntest}$ is the amount of DC current applied to the closed segment Sn(i).

In practice, when making a measurement $Rdson_s$ [measured] of the resistance of the switch with the test equipment, $$Rdson_s[measured]=Rdson_s[actual]+R[parasitic]$$

where $Rdson_s$ [actual] is the on-resistance of the switch (with all segments closed), and Rdson [parasitic] is the unwanted resistance due to wafer probe contact and automatic test equipment (ATE) contact resistance. However, when making a measurement $Rdson_{ni}$[measured] of the resistance of a single segment in the switch with the test equipment, it is also generally the case that $$Rdson_{ni}[measured]=Rdson_{ni}[actual]+R[parasitic]$$

where $Rdson_{ni}$ [actual] is the on-resistance of the segment based on the segment dimensions, and R[parasitic] is the unwanted resistance due to wafer probe contact and automatic test equipment (ATE) contact resistance.

Once the on-resistance $Rdson_{ni}$ [measured] of all of the segments Sn(i) of the rectifier switch 116 have been obtained, the average on-resistance $Rdson_{ni}$[measured] {avg} of the rectifier switch 116 can be calculated:

$$Rdson_{ni}[measured]\{avg\}=(Rdson_{nN}[measured]+ \ldots +Rdson_{ni}[measured])/N$$

We know that $$Rdson_{ni}[measured]\{avg\}=Rdson_{ni}[ideal]\{avg\}+R_i[parasitic]\{avg\}$$

where $$Rdson_{ni}[ideal]\{avg\}=(Rdson_{nN}[ideal]+ \ldots +Rdson_{ni}[ideal])/N$$

and $$R_{ni}[parasitic]\{avg\}=(R_N[parasitic]+ \ldots +R_i[parasitic])/N$$

The on-resistance $Rdson_s$[calculated] of the rectifier switch 116 can be calculated from the following:

$$Rdson_s[calculated]=Rdson_{ni}[measured]\{avg\}/N$$

Since $$Rdson_{ni}[measured]\{avg\}/N=[Rdson_{ni}[ideal]\{avg\}+R_{ni}[parasitic]\{avg\}]/N=Rdson_s[ideal]+[R_{ni}[parasitic]/N]$$

it follows that $$Rdson_s[calculated]\approx Rdson_s[ideal]; \text{ for large } N$$

The value of N can be selected to achieve a desired measurement accuracy of the voltage drops $V_{ni}$[measured] across the respective closed segments Sn(i). Once the value of the low on-resistance $Rdson_{ntotal}$ [measured] of the rectifier switch 116 is obtained, a comparison of the measured on-resistance $Rdson_{ntotal}$ [measured] and the ideal on-resistance $Rdson_{ntotal}$[ideal] can be made. If, $Rdson_{ntotal}$ [measured]>>$Rdson_{ntotal}$ [ideal], then a failure analysis of the rectifier switch 116 can be performed by analyzing each segment's on-resistance $Rdson_{ni}$ [measured]. In this manner, segments that failed—i.e., segments Sn(i) having $Rdson_{ni}$ [measured]>>$Rdson_{ni}$ [ideal]—can be easily identified. The on-resistance $Rdson_{ptotal}$[measured] of the power switch 112 can be similarly calculated.

In high output current applications, the performance of the switching regulator 102 can be evaluated using a closed-loop verification technique. In order to avoid the practical problems introduced by ATE contact inductances (e.g., large transient noise across the switching regulator 102), the switching regulator 102 can be placed in a low output current test mode of operation. The closed-loop characteristics of the switching regulator 102 can be easily verified as long as the loop gain and opened-loop pole locations are kept the same. In one implementation, a switching regulator 102 in the low output current test mode is configured as follows:
1. Partition each switch into N segments having equivalent segment widths $W_i$.
2. Close one of the N segments in each switch.
3. Increase the value of the output filter inductor 120 by N times (i.e., replace the discrete inductor component 120 having an inductance of L with a discrete inductor component 120' having an inductance of N*L). This will also serve to reduce AC ripple current passing through the regulator by the factor N.
4. Reduce the value of the output filter capacitor 122 by N times (i.e., replace the discrete capacitor component 122 having a capacitance of C with a discrete capacitance component 122' having a capacitance of C/N).
5. Reduce the tested load current range from 0-Imax to 0-Imax/N (Imax is the maximum load current for the switching regulator when using an application board).

FIG. 3 shows the switching regulator 1202 implemented as a chip 130 and an application board 131. As discussed above, the chip 130 contains the power switch 116, the rectifier switch 112 and the load 1208. The chip 130 interfaces with the application board 131, which contains the remainder of the regulator's components, including the inductor component 120 and the capacitor component 122.

Referring to FIG. 4, the chip 130 can be tested by installing the chip 130 with the power switches 112 and 116 on a test board 132. The test board 132 is identical to the application board, except for having a discrete inductor component 120' with an inductance of N*L (where L is the inductance of the discrete inductor component 120 on the application board 131) and a discrete capacitor component 122' with an inductance of C/N (where C is the capacitance of the discrete capacitor component 122 on the application board 131) and a maximum load current of Imax/N (where Imax is the maximum load current on the application board). The switching regulator 102 is then run using just one (or less than all) of the N segments. For example, in power switch 112, just one of the individual control signals Ctrlp(i) is set high, the remainder of the individual control signals Ctrlp(i) are set low, and the active segment is controlled by the common control signal Ctrl(PMOS_switch). The rectifier switch 116 can be controlled similarly. While the switching regulator is running, the automatic testing equipment can be used to test the voltage at various points on the circuit and perform a failure analysis. Assuming that the test is successful, the chip with the power switches 112 and 116 is then removed from the test board and installed on an application board 131 with the discrete inductor component 120 and discrete capacitor component 122.

As part of the testing, the closed-loop performance characteristic of the switching regulator can be measured. Two exemplary performance characteristics are the line regulation and the load regulator. To measure the line regulation, two measurements of the output voltage are performed. The first measurement is performed with the minimum input voltage, and the second measurement is performed with the maximum input voltage. The deviation between the two measurements provides an estimate of the line regulation when the chip is installed on the application board. To measure the load regulation, another two measurements of the output voltage are performed. The first measurement is performed with the minimum load current, e.g., zero, and the second measurement is performed with the maximum load current, e.g., Imax/N. The deviation between the two measurements provides an estimate of the load regulation when the chip is installed on the application board.

In this manner, the combination of (3) and (5) reduces the maximum current passed through the regulator by N times, the combination of (1), (3), and (5) reduces the voltage overstress by approximately N times, and the combination of (1), (3) and (4) keeps the loop gain and opened-loop dominant pole locations nearly similar to those in the application circuit. By using a fraction of each switch and adjusting the values of the external discrete output filter inductor and capacitor components, the closed-loop characteristics of the switching regulator 102 can be verified.

In addition, the general functionality of the various circuit blocks within the feedback control loop can be verified without having to measure each of the individual on-chip circuit blocks separately. This results in production test-time reduction and ultimately lower manufacturing costs.

The invention has been described in terms of particular embodiments. Other embodiments are within the scope of the following claims. For example, the steps of the invention can be performed in a different order and still achieve desirable results.

What is claimed is:

1. A method of testing a switching regulator with a power transistor on an integrated circuit chip for use with an application board having circuitry that includes a first inductor with a first inductance and a first capacitor with a first capacitance, comprising:

providing a power transistor including a plurality of individually-addressable transistor segments on a chip;

installing the chip on a testing board having circuitry that includes a second inductor with a second inductance greater than the first inductance and a second capacitor with a second capacitance less than the first capacitance;

operating the circuit with the power transistor on the integrated circuit chip using less than all of the transistor segments; and measuring a closed-loop performance characteristic of the switching regulator, wherein the switching regulator is not electrically coupled to the application board while it is installed on the testing board.

2. The method of claim 1, wherein the performance characteristic is output voltage.

3. The method of claim 1, wherein the performance characteristic is line regulation.

4. The method of claim 3, wherein measuring the line regulation includes measuring first and second output voltages with different input voltages.

5. The method of claim 1, wherein the performance characteristic is load regulation.

6. The method of claim 5, wherein measuring the load regulation includes measuring first and second output voltages with different load currents.

7. The method of claim 6, wherein the different load currents include a minimum load current and a modified maximum load current.

8. The method of claim 7, wherein the modified maximum load current is less than a maximum load current for the switching regulator when installed on an application board.

9. The method of claim 7, wherein the application board has a first load current, and the test board has a second load current that is less than the first load current.

10. The method of claim 1, further comprising removing the chip from a testing board and installing the chip on an application board having circuitry that includes a first inductor with a first inductance and a first capacitor with a first capacitance.

11. The method of claim 10, wherein the power transistor includes N transistor segments, and the operating step is performed using exactly one of the N transistor segments.

12. The method of claim 11, wherein the first inductance is L and the second inductance is L*N.

13. The method of claim 11, wherein the first capacitance is C and the second capacitance is C/N.

14. The method of claim 1, further comprising measuring an on-resistance of a closed transistor segment during operation of the circuitry.

15. The method of claim 14, further comprising deriving an on-resistance of the power transistor from the on-resistance of the closed transistor segment.

16. A method of testing a switching regulator with a power transistor on an integrated circuit chip for use with an application board having circuitry that includes a first inductor with a first inductance and a first capacitor with a first capacitance, comprising:

provid ing a power transistor including a plurality of individually-addressable transistor segments on a chip;

installing the chip on a testing board having circuitry that includes a second inductor with a second inductance greater than the first inductance and a second capacitor with a second capacitance less than the first capacitance;

operating the circuit with the power, transistor on the integrated circuit chip using less than all of the transistor segments;

measuring a closed-loop performance characteristic of the switching regulator;

removing the chip from the testing board; and installing the chip on the application board.

* * * * *